United States Patent [19]
Yamazaki et al.

[11] Patent Number: 6,025,630
[45] Date of Patent: *Feb. 15, 2000

[54] INSULATING FILM FORMED USING AN ORGANIC SILANE AND METHOD OF PRODUCING SEMICONDUCTOR DEVICE

[75] Inventors: Shunpei Yamazaki, Tokyo; Takeshi Fukada, Kanagawa; Mitsunori Sakama, Kanagawa; Yukiko Uehara, Kanagawa; Hiroshi Uehara, Kanagawa, all of Japan

[73] Assignee: Semiconductor Energy Laboratory Co., Ltd., Japan

[ * ] Notice: This patent is subject to a terminal disclaimer.

[21] Appl. No.: 09/190,828

[22] Filed: Nov. 12, 1998

Related U.S. Application Data

[62] Division of application No. 08/734,127, Oct. 21, 1996, Pat. No. 5,866,932, which is a continuation of application No. 08/455,574, May 31, 1995, abandoned, which is a division of application No. 08/198,054, Feb. 18, 1994, abandoned.

[30] Foreign Application Priority Data

Feb. 19, 1993 [JP] Japan ......................... 5-55236

[51] Int. Cl.[7] .......................... H01L 27/01; H01L 29/76; H01L 29/94; H01L 31/062

[52] U.S. Cl. ......................... 257/347; 257/66; 257/410; 257/411

[58] Field of Search ............................ 257/66, 347, 350, 257/351, 410, 411; 438/386, 763, 161, 695, 166

[56] References Cited

U.S. PATENT DOCUMENTS

| | | | |
|---|---|---|---|
| 4,810,673 | 3/1989 | Freeman | 437/239 |
| 4,894,352 | 1/1990 | Lane et al. | 437/238 |
| 4,943,837 | 7/1990 | Konishi et al. | 257/347 |
| 5,013,691 | 5/1991 | Lory et al. | 437/238 |
| 5,037,766 | 8/1991 | Wang | 437/24 |
| 5,275,977 | 1/1994 | Ostubo et al. | 437/235 |
| 5,403,772 | 4/1995 | Zhang et al. | 437/101 |
| 5,866,932 | 2/1999 | Yamazaki et al. | 257/347 |

FOREIGN PATENT DOCUMENTS

| | | | |
|---|---|---|---|
| 61-63020 | 4/1986 | Japan | 437/101 |
| 5-175132 | 7/1993 | Japan | 437/101 |

*Primary Examiner*—Steven H. Loke
*Attorney, Agent, or Firm*—Sixbey, Friedman, Leedom & Ferguson, PC; Jeffrey L. Costellia

[57] ABSTRACT

A silicon oxide film is formed to cover an island non-monocrystalline silicon region by plasma CVD using an organic silane having ethoxy groups (e.g., TEOS) and oxygen as raw materials, while hydrogen chloride or a chlorine-containing hydrocarbon (e.g., trichloroethylene) of a fluorine-containing gas is added to the plasma CVD atmosphere, preferably in an amount of from 0.01 to 1 mol % of the atmosphere so as to reduce the alkali elements from the silicon oxide film formed and to improve the reliability of the film. Prior to forming the silicon oxide film, the silicon region may be treated in a plasma atmosphere containing oxygen and hydrogen chloride or a chlorine-containing hydrocarbon. The silicon oxide film is obtained at low temperatures and this has high reliability usable as a gate-insulating film in a semiconductor device.

16 Claims, 3 Drawing Sheets

INSULATING FILM FORMED USING AN ORGANIC SILANE AND METHOD OF PRODUCING SEMICONDUCTOR DEVICE

This application is a divisional application of U.S. Ser. No. 08/734,127 filed Oct. 21, 1996, now U.S. Pat. No. 5,866,932, which is a continuation of 08/455,574 filed May 31, 1995, now abandoned, which is a divisional of Ser. No. 08/198,054 filed Feb. 18, 1994 now abandoned.

FIELD OF THE INVENTION

The present invention relates to a method for producing a gate-insulating film which is used in a thin film device such as a gate-insulated field effect transistor or the like, at a low temperature of 650° C. or lower, and also to the insulating film produced by the method.

BACKGROUND OF THE INVENTION

Heretofore, in a thin film device such as a gate-insulated field effect thin-film-transistor (TFT) or the like, a silicon oxide film with good characteristics, which is obtained by forming a crystalline silicon followed by heating and oxidizing its surface at high temperatures falling within a range of from 900 to 1100° C., has been used as a gate-insulating film.

The oxide film formed by such thermal oxidation is essentially characterized in that its interfacial level density is extremely low and that it may be formed on the surface of a crystalline silicon at a uniform thickness. Accordingly, the former brings about good on/off characteristics and long-term reliability on bias/temperature; while the latter reduces the short circuit between a gate electrode and a semiconductor area (active layer) at the edges in an island semiconductor region to thereby improve the production yield of semiconductor devices.

To use such a thermal oxide film in producing semiconductor devices, however, a material which is resistant to high temperatures must be selected as the material for the substrate. In this respect, since inexpensive glass materials (for example, alkali-free glass such as Corning 7059, etc.) cannot be used, the production costs are disadvantageously high especially when large-area substrates are used. Recently, a technical means for forming TFT on an alkali-free substrate is being developed, in which, however, a thermal oxide film cannot be used but a gate-insulating film shall be formed by sputtering or by physical or chemical vapor deposition (CVD) such as plasma CVD or reduced pressure CVD.

However, it was inevitable that the characteristics of the silicon oxide film formed by such means were inferior to those of the thermal oxide film. Namely, the interfacial level density of the former is generally large and, additionally, the former was always accompanied by the dangers of alkali ions such as sodium ions or the like invading the film being formed. In addition, since the step coverage of the silicon oxide film is not so good, the film frequently caused the short circuit between the gate electrode and the active layer at the edges of the island semiconductor region. For these reasons, it was extremely difficult to obtain semiconductor devices of the kind satisfying all the characteristics, the reliability and the production yield by the prior art technology.

SUMMARY OF THE INVENTION

The present invention has been made so as to solve at least one of these problems in the prior art technology. Accordingly, one object of the present invention is to provide a method for producing a silicon oxide film with good step coverage. Another object of the present invention is to provide a silicon oxide film which is resistant to unfavorable impurities such as alkali ions and others and also to provide a method for producing the film.

First, the present invention is characterized in that a film which has been obtained by plasma CVD using a mixed gas containing an organic silane having ethoxy groups, oxygen, and hydrogen chloride or a chlorine-containing hydrocarbon, as the raw material gas, and consists essentially of silicon oxide is used as a gate-insulating film.

Secondly, the present invention is also characterized in that a film which has been obtained by plasma CVD using a mixed gas containing an organic silane having ethoxy groups, oxygen, and a fluorine-containing gas (e.g., $NF_3$, $C_2F_6$), as the raw material gas, and consists essentially of silicon oxide is used as a gate-insulating film.

Accordingly, the present invention provides an insulating film consisting essentially of silicon oxide, which has been formed on an island non-monocrystalline semiconductor region consisting essentially of silicon to closely cover the region and is characterized in that from $1 \times 10^{17}$ to $5 \times 10^{20}$ $cm^{-3}$ of halogens are detected from the film by secondary mass spectrometry and that $5 \times 10^{19}$ $cm^{-3}$ or less carbons are detected therefrom.

The present invention also provides a first method of producing a semiconductor device comprising a first step for forming an island non-monocrystalline semiconductor region consisting essentially of silicon and a second step for forming a film consisting essentially of silicon oxide over the non-monocrystalline semiconductor region in a plasma atmosphere resulting from a mixed gas containing an organic silane having ethoxy groups, oxygen, and hydrogen chloride or a chlorine-containing hydrocarbon.

The present invention further provides a second method of producing a semiconductor device comprising a first step for forming an island non-monocrystalline semiconductor region consisting essentially of silicon, a second step for exposing the island semiconductor region to a plasma atmosphere containing oxygen, and hydrogen chloride or a chlorine-containing hydrocarbon, and a third step for forming a film consisting essentially of silicon oxide over the non-monocrystalline semiconductor region in a plasma atmosphere resulting from a mixed gas containing an organic silane having ethoxy groups and oxygen.

DETAILED DESCRIPTION OF THE INVENTION

Figure 1A:
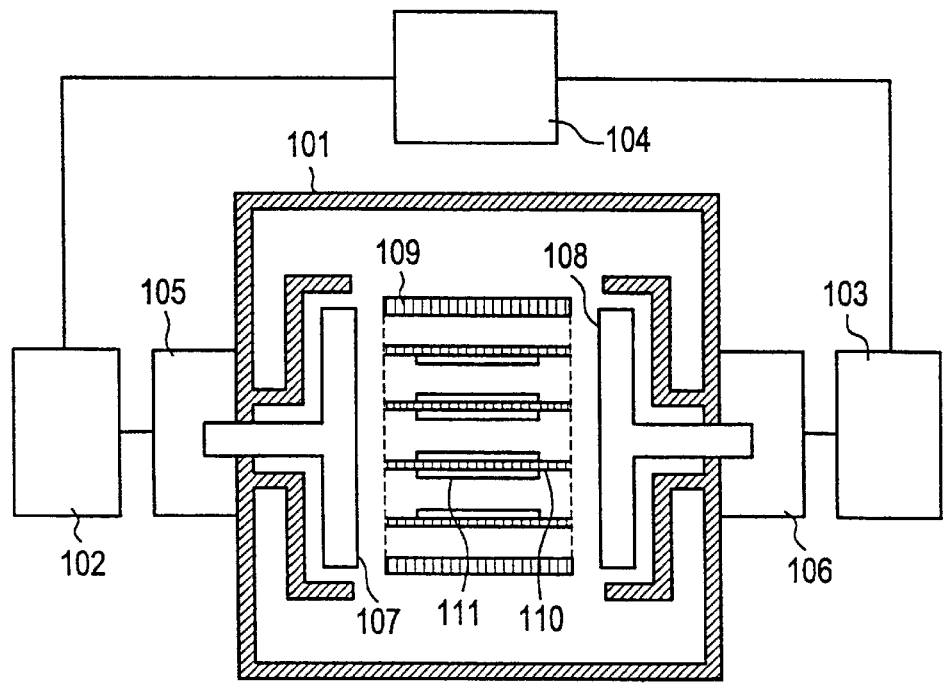
FIG. 1(A) is a conceptual cross-sectional view showing a positive column CVD apparatus used in an example of the present invention.

As the organic silane having ethoxy groups, preferred are substances to be represented by chemical formulae $Si(OC_2H_5)_4$ (tetraethoxysilane, hereinafter referred to as TEOS), $Si_2O(OC_2H_5)_6$, $Si_3O_2(OC_2H_5)_8$, $Si_4O_3(OC_2H_5)_{10}$ and $Si_5O_4(OC_2H_5)_{12}$. Since these organic silane materials move on the surface of the substrate for a long period of time to be decomposed on the surface to form a silicon oxide film thereon, they may well get into even hollows to give an excellent film with good step coverage.

As the chlorine-containing hydrocarbon, preferred are substances to be represented by chemical formulae $C_2HCl_3$ (trichloroethylene), $C_2H_3Cl_3$ (trichloroethane) and $CH_2Cl_2$ (dichloromethane). The chlorine-containing gas of the kind is decomposed essentially in a vapor phase to be compounded with alkali elements such as sodium or the like that exists in the filming atmosphere, whereupon the resulting compound removes from the substrate to accelerate the removal of alkali elements from the silicon oxide film being formed. Some chlorine atoms still remain in the silicon oxide film formed, and these function as a barrier therein against alkali elements which will try to invade the film from the outward later on. As a result, the reliability of TFT may be improved. The concentration of the chlorine-containing hydrocarbon is preferably from 0.01 to 1% relative to the whole mixed gas. If it is more than 1%, the gas will have bad influences on the characteristics of the film formed.

In the insulating film consisting essentially of silicon oxide, thus formed by the above-mentioned method, halogen elements (e.g., fluorine or chlorine) are detected in an amount of from $1\times10^{17}$ from $5\times10^{20}$ cm$^{-3}$ as impurity elements by secondary ion mass spectrometry, while the carbon concentration is $5\times10^{19}$ cm$^{-3}$ or less. In particular, in order to lower the interfacial level density of the film, it is desired that the carbon concentration is $1\times10^{18}$ cm$^{-3}$ or less. In order to lower the carbon concentration, the temperature of the substrate during filming may be 200° C. or higher, preferably 300° C. or higher.

On the insulating film to be formed in this manner, many dangling bonds are often precipitated in the initial stage of its filming. Therefore, it is preferred to previously expose the substrate semiconductor layer (this preferably consists essentially of silicon) to a plasma atmosphere containing oxygen. As a result, the interfacial level density is lowered while the fluctuations of the flat band potential in the bias/temperature test are reduced, and therefore the reliability of the semiconductor device to be formed is improved. It is also preferred to add to the atmosphere hydrogen chloride or a chlorine-containing material such as trichloroethylene, trichloroethane, dichloromethane or the like, in addition to oxygen, to further improve the effect.

On the other hand, after the formation of the insulating film consisting essentially of silicon oxide by the above-mentioned method, the film may further be heat-treated at temperatures falling within the range of from 200 to 650° C. to thereby reduce the fluctuations of the flat band potential. The heat treatment is preferably conducted in an oxygen-free atmosphere such as argon, nitrogen or the like. The fluctuations of the flat band potential are noticeably reduced by the heat treatment at 450° C. or higher and the reduction is saturated at 600° C. or higher.

The second method of the present invention is characterized by comprising exposing an island non-monocrystalline semiconductor region consisting essentially of silicon to a plasma atmosphere containing oxygen, and hydrogen chloride or a chlorine-containing hydrocarbon, followed by forming a film consisting essentially of silicon oxide over the non-monocrystalline semiconductor region by plasma CVD using a raw material containing an organic silane having ethoxy groups and oxygen.

In the second method, hydrogen chloride or a chlorine-containing hydrocarbon is essentially accumulated in the chamber during the plasma treatment, which brings about the same effect as that to be brought about by the above-mentioned first method where hydrogen chloride or a chlorine-containing hydrocarbon is added, during the following step of forming the silicon oxide film. The same as that mentioned above shall apply to the second step with respect to the improvement in the reliability attainable by the plasma treatment. To obtain a better result from the second method, it is also preferred that the chlorine concentration and the carbon concentration in the silicon oxide film thus formed by the second method are the same as those in the film formed by the above-mentioned the first method. It is also preferred in the second method that the film consisting essentially of silicon oxide thus formed is subjected to heat treatment at 200 to 650° C., preferably at 450 to 600° C., after the filming in order to obtain a further better result.

The plasma CVD apparatus to be employed in the present invention may be either an ordinary parallel plate-type apparatus (in which a pair of electrode plates are located in a chamber, facing to each other, and one or both of them has/have a sample substrate mounted thereon) or a positive column-type apparatus such as that used in the following example.

However, the latter is preferred to the former in view of the following two points. One is that the amount of the substrates to be treated at one time is determined by the area of the electrodes used in the former, while it is determined by the discharging volume in the latter. Accordingly, a larger amount of substrates may be processed at one time by the latter. The other is that the surface of the substrate treated by the former is much damaged by the plasma, while the latter is almost free from the damage by the plasma since it has almost no potential inclination. In addition, since the uniformity of the film to be formed using the latter is better than that using the former, the uniform film has no bad influences on the characteristics of TFT and the production yield thereof.

It is necessary that the chamber of the plasma CVD apparatus to be used for the filming in the present invention is sufficiently cleaned, prior to its use, so as to reduce the content of alkali elements, such as sodium, etc., in the chamber. To clean the chamber, chlorine, hydrogen chloride or the above-mentioned chlorine-containing hydrocarbon may be introduced into the chamber along with oxygen, and thereafter the plasma may be generated therein. It is preferred that the chamber is heated at 150° C. or higher, preferably 300° C. or higher, so as to more effectively carry out the step.

EXAMPLE

Figure 1B:
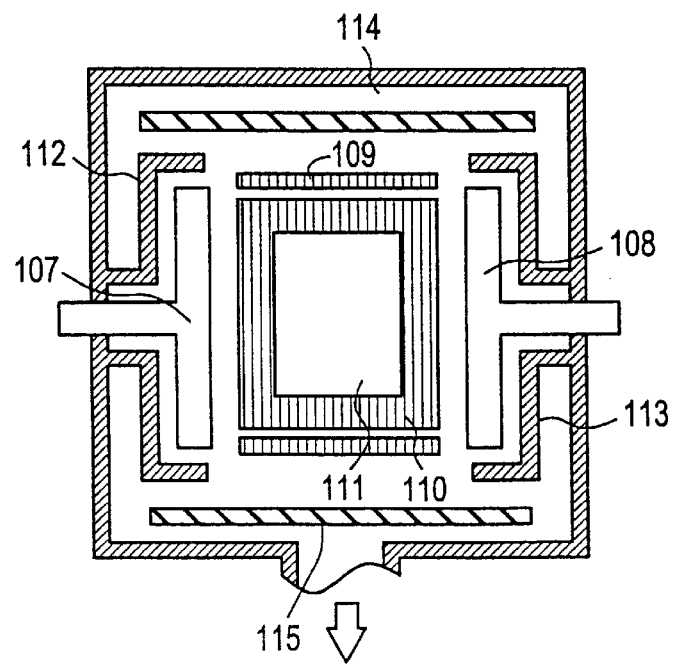
FIG. 1(B) is a conceptual plan view showing the positive column CVD apparatus shown in FIG. 1(A).

This example demonstrates one embodiment of the present invention of forming a silicon oxide film, as the gate-insulating film, on an island non-monocrystalline silicon semiconductor film by positive column plasma CVD, essentially showing the electric characteristics of the silicon oxide film formed. The plasma CVD apparatus used herein is shown in FIG. 1. FIG. 1(A) is a vertical cross-sectional view of the apparatus, and FIG. 1(B) is a top plan view of the same. The positive column CVD is characterized in that the substrate to be coated is located in the positive column region for plasma discharging and is coated with films therein.

The RF power sources 102 and 103 give the power to generate plasma. Regarding the frequency from the sources, radio waves are typically employed, having a frequency of 13.56 MHz. The power fed from the two power sources is adjusted by the phase shifter 104 and the matching boxes 105 and 106 in such a way that the condition of the plasma to be formed is the best. The power derived from the RF power sources arrives at the pair of electrodes 107 and 108 that have been located in parallel to each other in the inside of the chamber 101 and have been protected by the electrode covers 112 and 113, thus causing discharging between these electrodes. Substrates to be treated are located between the electrodes 107 and 108. In order to improve the mass-producibility, the substrates 111 are cased in a container 109, where they are attached to the both surfaces of the sample holders 110. The substrates are characterized in that they are parallel to each other between the electrodes. The substrates are heated by the infrared lamp 114 and kept at suitable temperatures. Though not shown, the apparatus is fitted with a gas exhauster and a gas-feeding means.

The filming conditions and the characteristics of the film formed are mentioned below. The temperature of the substrates was 300° C. Into the chamber, 300 SCCM of oxygen, 15 SCCM of TEOS and 2 SCCM of trichloroethylene (hereinafter referred to as TCE) were introduced into the chamber. The RF power was 75 W, and the whole pressure was 5 Pa. After the filming, the film formed was annealed in hydrogen atmosphere at 350° C. for 35 minutes.

Figure 3:
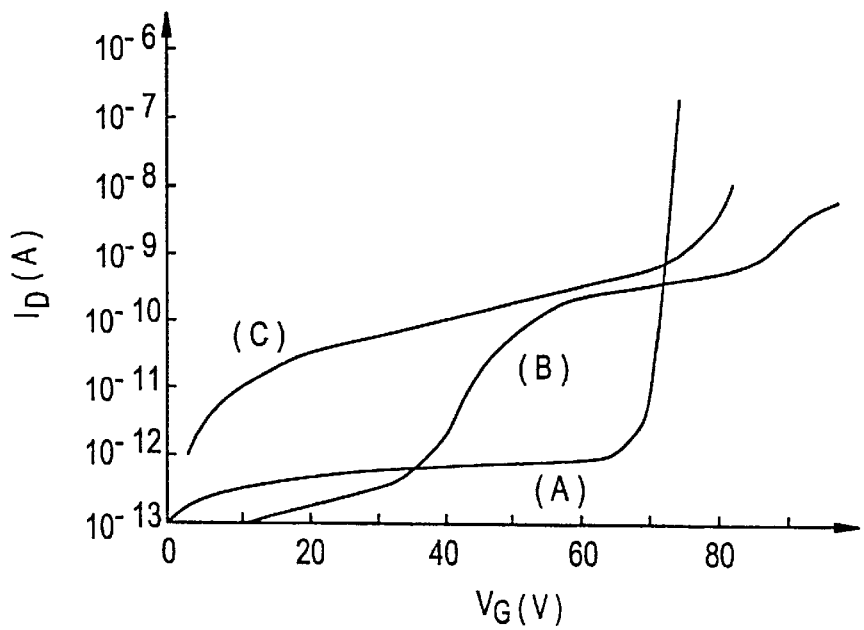
FIG. 3 shows the characteristic curves of breakdown voltage of the insulating films obtained in the example.

FIG. 3 shows the results of the dielectric breakdown test of the silicon oxide films of 1000 Å thick that had been formed on high-resistance silicon wafers using the present apparatus. Over the silicon oxide film, formed was a 1 mmφ-aluminum electrode and the relation between the voltage and the current was plotted. FIG. 3(C) indicates the film that had been formed on the substrate without any particular treatment of the substrate prior to the filming, from which it is noted that the breakdown voltage of the film is low. The films of FIG. 3(A) were formed as follows: After the substrates were set in the chamber, they were heated at 300° C. and exposed to the plasma atmosphere generated by introducing 400 SCCM of oxygen and from 0 to 5 SCCM of TCE. The total pressure of the atmosphere was 5 Pa, and the RF power was 150 W. The plasma exposure was carried out for 10 minutes. (During the step, no film was formed by the gaseous reaction.) After the plasma exposure, the silicon oxide films of FIG. 3(A) were formed, and they showed a high breakdown voltage.

The films of FIG. 3(B) were formed as follows in the same manner as in FIG. 3(A) except that the flow rate of TCE in the filming step was changed to 4 SCCM or more, for example 5 SCCM. As shown, they had a low breakdown voltage. From these results, it has been found that the TCE concentration for the filming has the optimum value.

Figure 4A:
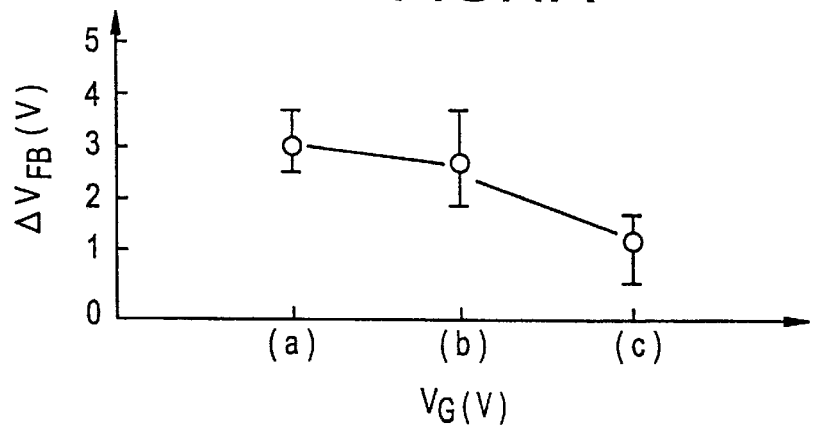
FIGS. 4(A) and 4(B) show the characteristic curves of $V_{FB}$ of the insulating films obtained in the example.

FIG. 4(A) shows the result of the bias/temperature test, as one example of the reliability tests, of the insulating films formed in this example, indicating the relation between the fluctuations ($V_{FB}$) of the flat band voltage ($V_{FB}$) and the pre-treatment, if any, of the substrates. In the bias/temperature test, a voltage of +17 V was imparted to the sample at 150° C. for one hour and the C-V characteristic of the sample was measured at room temperature. Next, a voltage of -17 V was imparted to the same sample at 150° C. for one hour and the C-V characteristic thereof was also measured at room temperature. The difference in $V_{FB}$ between the two measurements was obtained to be $V_{FB}$.

In FIG. 4(A), the substrate of the sample (a) was not pre-treated. $V_{FB}$ of the sample (a) was about 5 V and was relatively large. However, the problem was solved by pre-treating the substrate. The substrates of the samples (b) and (c) were pre-treated under the conditions mentioned below.

| Sample | (b) | (c) |
| --- | --- | --- |
| Temperature of Substrate | 300° C. | 300° C. |
| TCE/Oxygen | 0/400 | 0.5/400 |
| RF Power | 150 W | 150 W |
| Time for Treatment | 10 min | 10 min |

From FIG. 4(A), it is understood that the reliability of the insulating film was improved much more by pre-treating the substrate using TCE.

Figure 4B:
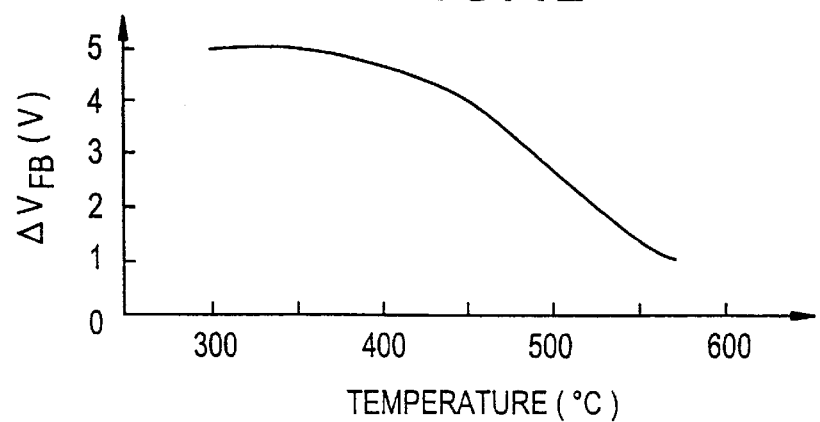

The same improvement may also be attained by annealing the insulating film formed. The annealing of the film was carried out in argon of one atmospheric pressure at 300 to 570° C. for one hour. The relation between the annealing temperature and $V_{FB}$ is shown in FIG. 4(B), from which it is noted that $V_{FB}$ was significantly reduced when the film was annealed at temperatures not higher than 450° C., while it became gradually constant when the annealing temperature was being near to 600° C. From the result, it was clarified that the annealing of the insulating film formed is effective in improving the reliability of the film.

On the basis of the results obtained from the above-mentioned experiments, a TFT sample was produced. The flow sheet for producing it is shown in FIG. 2. First, the silicon oxide film 202 of 2000 Å thick was formed, as a subbing film, on the substrate (Corning 7059) 201, by positive column plasma CVD using TEOS, oxygen and TCE as raw materials. The apparatus used herein was same as that shown in FIG. 1. The main conditions for the filming were as follows:

| Temperature of Substrate: | | 300° C. |
| --- | --- | --- |
| Whole Pressure: | | 5 Pa |
| Mixed Gas: | | |
| TOES: | 12 SCCM | |
| Oxygen: | 300 SCCM | |
| TCE: | 2 SCCM | |
| RF Power: | | 75 W |

Figure 2A:
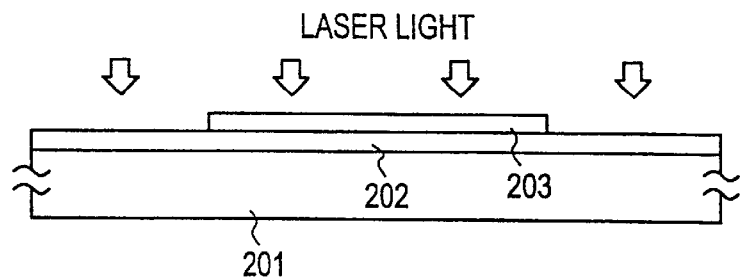
FIGS. 2(A) to 2(E) shows a flow sheet showing the formation of TFT in the example.

Next, an amorphous silicon film of 500 nm thick was deposited thereover by plasma CVD, and this was patterned to form the island silicon region 203. This was allowed to stand in nitrogen atmosphere at 400° C. for 30 minutes to remove hydrogen therefrom. Next, this was annealed with a laser ray, as shown in FIG. 2(A), to crystallize the silicon region. As the laser, used was a KrF excimer laser (having a wavelength of 248 nm and a pulse width of 20 nsec). The energy density was from 200 to 350 mM/cm$^2$. During the irradiation of the laser rays, the substrate was kept at 300 to 500° C., for example 450° C.

Figure 2B:
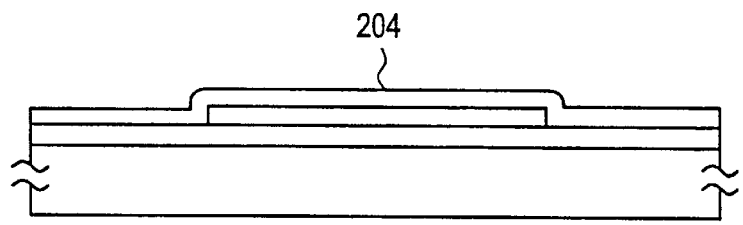

Afterwards, the silicon oxide film 204 of 1000 Å thick was formed to cover the island silicon region 203, as a gate-insulating film, by positive column plasma CVD using TEOS, oxygen and TCE as raw materials, as shown in FIG. 2(B). Prior to the filming, the substrate was pre-treated, using the same apparatus as in Example 1. The main conditions for the pre-treatment were as follows:

| Temperature of Substrate: | 300° C. |
|---|---|
| Whole Pressure: | 5 Pa |
| Mixed Gas: | |
| Oxygen: 400 SCCM | |
| TCE: 0.5 SCCM | |
| RF Power: 150 W | |
| Time for Treatment: | 10 minutes |

After the pre-treatment, the film 204 was formed. The main condition for the filming were mentioned below. After the filming, the film formed was annealed in argon atmosphere at 550° C. for one hour.

| Temperature of Substrate: | 300° C. |
|---|---|
| Whole Pressure: | 5 Pa |
| Mixed Gas: | |
| TEOS: 15 SCCM | |
| Oxygen: 300 SCCM | |
| TCE: 2 SCCM | |
| RF Power: | 75 W |

Figure 2C:
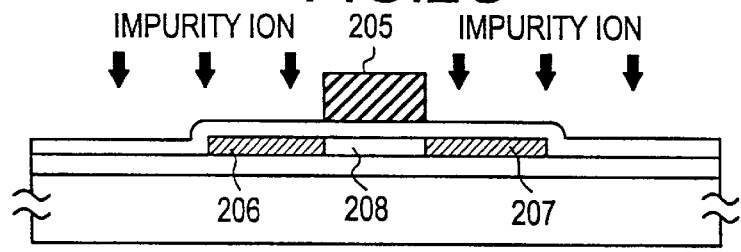

Next, a 2% silicon-doped aluminum film of 6000 Å thick was deposited over the film and this was patterned to form the gate electrode 205. Then, impurity ions (phosphorus or boron) were introduced into the region 203 in a self-ordered manner by plasma doping, using the gate electrode 205 as the mask, to form the impurity regions 206 and 207, as shown in FIG. 2(C). The area into which the impurities had not been introduced became the channel-forming region 208. Since the doping was conducted through the gate-insulating film, it needed an accelerated voltage of 80 kV for phosphorus and 65 kV for boron. The dose amount was suitable from $1 \times 10^{15}$ to $4 \times 10^{15}$ cm$^{-2}$.

Figure 2D:
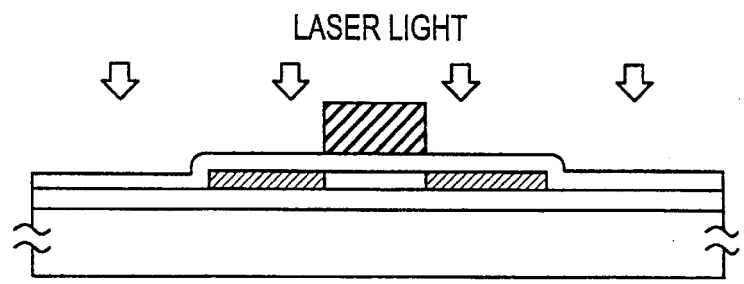
Figure 2E:
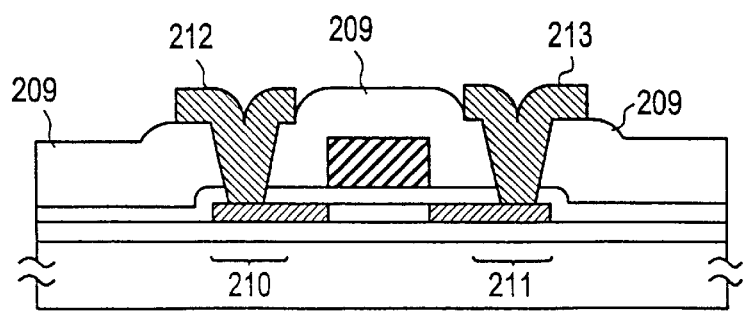

Next, the impurities were activated also by annealing with laser rays, as shown in FIG. 2(D). As the laser, used was the KrF excimer laser (having a wavelength of 248 nm and a pulse width of 20 nsec). The energy density was from 200 to 350 mJ/cm$^2$. During the irradiation of the laser rays, the substrate may be kept at 300 to 500° C. After the irradiation of the laser rays, this was annealed at 350° C. in hydrogen atmosphere having a partial pressure of from 0.1 to 1 atmospheric pressure for 35 minutes.

Next, the silicon oxide film 209 of 5000 Å thick was deposited thereover as an interlayer insulating film. The silicon oxide film 209 was formed by positive column CVD, using TEOS, oxygen and TCE as raw materials. The apparatus used for the filming was the same as in Example 1. The main conditions for the filming were as follows:

| Temperature of the Substrate: | 300° C. |
|---|---|
| Whole Pressure: | 5 Pa |
| Mixed Gas: | |
| TEOS: 30 SCCM | |
| Oxygen: 300 SCCM | |
| RF Power: | 100 W |

Afterwards, the contact holes 210 and 122 were formed through the interlayer insulating film, and the electrodes 212 and 213 were formed as a source and a drain, respectively, of TFT, using aluminum. In place of aluminum, also usable are titanium and titanium nitride. In this manner mentioned above, TFT was completed. The production yield of TFT was extremely improved, since the step coverage of the gate-insulating film was improved and the reliability of the gate-insulating film was improved.

As mentioned above in detail, the silicon oxide film of the present invention has sufficient reliability as a gate-insulating film. In addition, it has become obvious that the present invention contributes to not only the improvement in the reliability of the film but also the improvement in the production yield. Moreover, the mass-producibility of the device of the present invention may be improved, using the positive column plasma CVD apparatus such as that employed in the example. Thus, the present invention is useful as an industrial invention.

While the invention has been described in detail and with reference to specific embodiments thereof, it will be apparent to one skilled in the art that various changes and modifications can be made therein without departing from the spirit and scope thereof.

We claim:

1. An insulating film comprising silicon oxide formed over a glass substrate,
   wherein said insulating film includes halogen at a concentration of $1 \times 10^{17}$ to $5 \times 10^{20}$ cm$^{-3}$ and carbon at a concentration of $5 \times 10^{19}$ cm$^{-3}$ or less which are detected by secondary ion mass spectroscopy.

2. The film according to claim 1, wherein the halogen is fluorine or chlorine.

3. The film according to claim 1, wherein said insulating film includes carbon at a concentration of $1 \times 10^{18}$ cm$^{-3}$ or less which is detected by the secondary ion mass spectroscopy.

4. The film according to claim 1, wherein said insulating film is a gate insulating film.

5. The film according to claim 1 wherein said insulating film is an insulating film in a thin film transistor.

6. The film according to claim 1, wherein said insulating film covers an even surface over the glass substrate.

7. A semiconductor device comprising:
   a crystalline semiconductor island formed over a glass substrate; and
   an insulating film including silicon oxide formed to cover the crystalline semiconductor island,
   wherein said insulating film includes halogen at a concentration of $1 \times 10^{17}$ to $5 \times 10^{20}$ cm$^{-3}$ and carbon at a concentration of $5 \times 10^{19}$ cm$^{-3}$ or less.

8. The device according to claim 7, wherein the concentrations of halogen and carbon are detected by secondary ion mass spectroscopy.

9. The device according to claim 7, wherein said halogen is fluorine or chlorine.

10. The device according to claim 7, wherein said insulating film is formed by plasma chemical vapor deposition using an organic silane.

11. A thin film transistor comprising:
    a crystalline semiconductor island formed over a glass substrate;
    a silicon oxide film formed to cover the crystalline semiconductor island; and
    a conductive film including at least one of aluminum, titanium, and titanium nitride, said conductive film being formed on the silicon oxide film,
    wherein the silicon oxide film includes halogen at a concentration of $1 \times 10^{17}$ to $5 \times 10^{20}$ cm$^{-3}$ and carbon at a concentration of $5 \times 10^{19}$ cm$^{-3}$ or less.

12. The transistor according to claim 11, wherein said halogen is fluorine or chlorine.

13. The transistor according to claim 11, wherein said silicon oxide film is formed by plasma chemical vapor deposition using an organic silane.

14. A thin film transistor comprising:
- a crystalline semiconductor island formed over a glass substrate;
- a gate insulating film including silicon oxide formed on the crystalline semiconductor island; and
- a gate electrode formed on the insulating film, wherein said gate insulating film includes halogen at a concentration of $1 \times 10^{17}$ to $5 \times 10^{20}$ cm$^{-3}$ and carbon at a concentration of $5 \times 10^{19}$ cm$^{-3}$ or less.

15. The transistor according to claim 14, wherein said halogen is fluorine or chlorine.

16. The transistor according to claim 14, wherein said gate insulating film is formed by plasma chemical vapor deposition using an organic silane.

* * * * *

EX PARTE REEXAMINATION CERTIFICATE (4880th)
United States Patent
Yamazaki et al.

(10) Number: US 6,025,630 C1
(45) Certificate Issued: Nov. 11, 2003

(54) INSULATING FILM FORMED USING AN ORGANIC SILANE AND METHOD OF PRODUCING SEMICONDUCTOR DEVICE

(75) Inventors: Shunpei Yamazaki, Tokyo (JP); Takeshi Fukada, Kanagawa (JP); Mitsunori Sakama, Kanagawa (JP); Yukiko Uehara, Kanagawa (JP); Hiroshi Uehara, Kanagawa (JP)

(73) Assignee: Semiconductor Energy Laboratory Co., Ltd., Atsugi (JP)

Reexamination Request:
No. 90/006,057, Jul. 10, 2001

Reexamination Certificate for:
Patent No.: 6,025,630
Issued: Feb. 15, 2000
Appl. No.: 09/190,828
Filed: Nov. 12, 1998

(*) Notice: This patent is subject to a terminal disclaimer.

Related U.S. Application Data

(62) Division of application No. 08/734,127, filed on Oct. 21, 1996, now Pat. No. 5,866,932, which is a continuation of application No. 08/455,574, filed on May 31, 1995, now abandoned, which is a division of application No. 08/198,054, filed on Feb. 18, 1994, now abandoned.

(30) Foreign Application Priority Data

Feb. 19, 1993 (JP) .................................. 5-55236

(51) Int. Cl.[7] .......................... H01L 27/01; H01L 29/76; H01L 29/94; H01L 31/062
(52) U.S. Cl. .......................... 257/347; 257/66; 257/410; 257/411
(58) Field of Search .......................... 257/66, 347, 350, 257/351, 410, 411; 438/386, 763, 161, 695, 166

(56) References Cited

U.S. PATENT DOCUMENTS

| | | | |
|---|---|---|---|
| 4,772,927 A | 9/1988 | Saito et al. |
| 5,288,518 A | 2/1994 | Homma |
| 5,313,075 A | 5/1994 | Zhang et al. |
| 5,313,076 A | 5/1994 | Yamazaki et al. |
| 5,429,995 A | 7/1995 | Nishiyama et al. |
| 5,641,581 A | 6/1997 | Nishiyama et al. |
| 5,821,138 A | 10/1998 | Yamazaki et al. |
| 5,837,614 A | 11/1998 | Yamazaki et al. |

FOREIGN PATENT DOCUMENTS

| | | |
|---|---|---|
| JP | 59-115564 | 7/1984 |
| JP | 01-238024 | 9/1989 |

(List continued on next page.)

OTHER PUBLICATIONS

Van der Meulen et al., "Effects of HC1 and $Cl_2$ Additions on Silicon Oxidation Kinetics", pp. 371–389, 1974, Journal of Electronic Materials. vol. 3, No. 2.

(List continued on next page.)

*Primary Examiner*—Sara W Crane

(57) ABSTRACT

A silicon oxide film is formed to cover an island non-monocrystalline silicon region by plasma CVD using an organic silane having ethoxy groups (e.g., TEOS) and oxygen as raw materials, while hydrogen chloride or a chlorine-containing hydrocarbon (e.g., trichloroethylene) of a fluorine-containing gas is added to the plasma CVD atmosphere, preferably in an amount of from 0.01 to 1 mol % of the atmosphere so as to reduce the alkali elements from the silicon oxide film formed and to improve the reliability of the film. Prior to forming the silicon oxide film, the silicon region may be treated in a plasma atmosphere containing oxygen and hydrogen chloride or a chlorine-containing hydrocarbon. The silicon oxide film is obtained at low temperatures and this has high reliability usable as a gate-insulating film in a semiconductor device.

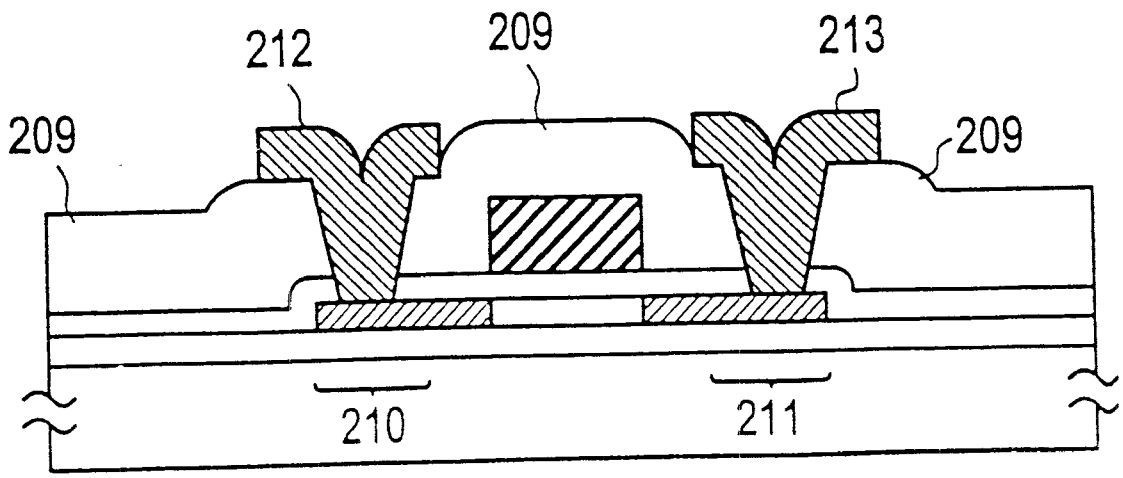

FOREIGN PATENT DOCUMENTS

| | | |
|---|---|---|
| JP | 01-268064 | 10/1989 |
| JP | 03-019340 | 1/1991 |
| JP | 03-036767 | 2/1991 |
| JP | 03-268429 | 11/1991 |
| JP | 03-289140 | 12/1991 |
| JP | 04-360533 | 12/1992 |
| JP | 05-074763 | 3/1993 |
| JP | 05-267480 | 10/1993 |
| JP | 06-053503 | 2/1994 |
| JP | 06-287755 | 10/1994 |
| JP | 07-074245 | 3/1995 |

OTHER PUBLICATIONS

Wright et al., "The Effect of Fluorine in Silicon Dioxide Gate Dielectrics", pp. 879–889, May 1989, IEEE Transactions on Electron Devices, vol. 36, No. 5.

Nishioka et al., "Radiation Hardened Micron and Submicron Mosfets Containing Fluorinated Oxides", pp. 2116–2123, Dec. 1989, IEEE Transactions on Nuclear Science vol. 36, No. 6.

Wright et al., "Hot–Electron Immunity of $SiO_2$ Dielectrics with Fluorine Incorporation", pp. 347–348, Aug. 1989, IEEE Electron Device Letters, vol. 10, No. 8.

Baker et al., "The Influence of Fluorine on Threshold Voltage Instabilities in P+ Polysilicon Gated P–Channel Mosfets", pp. 443–446, 1989, IEDM 17.1.1.

MacWilliams et al., "Improved Hot–Carrier Resistance with Fluorinated Gate Oxides", pp. 3–5, Jan. 1990, IEEE Electron Device Letters, vol. 11, No. 1.

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1–16 is confirmed.

* * * * *